United States Patent
Jeon et al.

(10) Patent No.: US 7,928,492 B2
(45) Date of Patent: Apr. 19, 2011

(54) NON-VOLATILE MEMORY INTEGRATED CIRCUIT DEVICE AND METHOD OF FABRICATING THE SAME

(75) Inventors: Hee-seog Jeon, Suwon-si (KR); Jeong-uk Han, Suwon-si (KR); Hyun-khe Yoo, Suwon-si (KR); Yong-kyu Lee, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 753 days.

(21) Appl. No.: 11/804,329

(22) Filed: May 17, 2007

(65) Prior Publication Data
US 2007/0267684 A1 Nov. 22, 2007

(30) Foreign Application Priority Data
May 19, 2006 (KR) .................. 10-2006-0045250

(51) Int. Cl.
*H01L 29/76* (2006.01)
(52) U.S. Cl. .................. 257/314; 257/E29.304; 257/331
(58) Field of Classification Search .......... 257/314–322, 257/428, 335, 341–342, E21.422, E29.3, 257/29.304; 365/186–188
See application file for complete search history.

(56) References Cited

U.S. PATENT DOCUMENTS

| | | | |
|---|---|---|---|
| 5,326,999 A | 7/1994 | Kim et al. | |
| 5,801,414 A | 9/1998 | Shinmori | |
| 5,973,357 A | 10/1999 | Uenoyama et al. | |
| 6,232,634 B1 | 5/2001 | Wu et al. | |
| 6,316,317 B1 * | 11/2001 | Kawata et al. | 438/289 |
| 6,344,993 B1 | 2/2002 | Harari et al. | |
| 6,436,764 B1 | 8/2002 | Hsieh | |
| 6,706,602 B2 * | 3/2004 | Hsu et al. | 438/267 |
| 6,794,711 B2 | 9/2004 | Kang et al. | |
| 6,914,290 B2 | 7/2005 | Yoo et al. | |
| 6,914,825 B2 | 7/2005 | Hsu et al. | |
| 7,166,887 B2 | 1/2007 | Park et al. | |
| 7,211,492 B2 * | 5/2007 | Forbes et al. | 438/305 |
| 7,514,744 B2 * | 4/2009 | Buh et al. | 257/344 |
| 2001/0038118 A1 * | 11/2001 | Sakui et al. | 257/315 |

(Continued)

FOREIGN PATENT DOCUMENTS

JP 2000-269361 9/2000

(Continued)

*Primary Examiner* — Matthew W Such
*Assistant Examiner* — Ali Naraghi
(74) *Attorney, Agent, or Firm* — Mills & Onello, LLP

(57) ABSTRACT

A non-volatile memory integrated circuit device and a method fabricating the same are disclosed. The non-volatile memory integrated circuit device includes a semiconductor substrate, word and select lines, and a floating junction region, a bit line junction region and a common source region. The semiconductor substrate has a plurality of substantially rectangular field regions, and the short and long sides of each substantially rectangular field region are parallel to the row and column directions of a matrix, respectively. The word lines and select lines extend parallel to the row direction on the semiconductor substrate, the word lines crossing a plurality of substantially rectangular field regions disposed in the row direction, and the select lines partially overlapping substantially rectangular field regions arranged in the row direction of the matrix, such that the parts of the long sides of the substantially field regions and the short sides of the substantially rectangular field regions are located below the select lines. The floating junction region is formed within the semiconductor substrate between the word lines and the select lines, the bit line junction region is formed opposite the floating junction region, and the common source region is formed opposite the floating junction region.

21 Claims, 16 Drawing Sheets

U.S. PATENT DOCUMENTS

| | | | |
|---|---|---|---|
| 2003/0127682 A1* | 7/2003 | Lee et al. | 257/315 |
| 2003/0127684 A1 | 7/2003 | Yoo et al. | |
| 2003/0146465 A1* | 8/2003 | Wu | 257/314 |
| 2004/0046210 A1 | 3/2004 | Kang et al. | |
| 2005/0001260 A1 | 1/2005 | Park et al. | |
| 2005/0245031 A1 | 11/2005 | Jeon et al. | |
| 2005/0282343 A1* | 12/2005 | Shin et al. | 438/296 |
| 2006/0006453 A1 | 1/2006 | Yu et al. | |
| 2006/0008985 A1 | 1/2006 | Park et al. | |
| 2006/0081914 A1* | 4/2006 | Miwa | 257/316 |
| 2006/0102950 A1* | 5/2006 | Takebuchi et al. | 257/316 |
| 2006/0199334 A1 | 9/2006 | Park et al. | |
| 2008/0315289 A1 | 12/2008 | Kim et al. | |

FOREIGN PATENT DOCUMENTS

| | | |
|---|---|---|
| JP | 2003209195 | 7/2003 |
| KR | 0183794 | 3/1999 |
| KR | 10-2004-0023295 | 3/2004 |
| KR | 10-2005-0005304 | 1/2005 |
| KR | 10-2005-0030456 | 3/2005 |
| KR | 10-2005-0105366 | 11/2005 |
| KR | 10-2006-0003485 | 1/2006 |
| KR | 10-2006-0005190 | 1/2006 |

* cited by examiner

NON-VOLATILE MEMORY INTEGRATED CIRCUIT DEVICE AND METHOD OF FABRICATING THE SAME

CROSS-REFERENCE TO RELATED APPLICATION

This application claims priority from Korean Patent Application No. 10-2006-0045250 filed on May 19, 2006 in the Korean Intellectual Property Office, the contents of which are incorporated herein by reference in their entirety.

BACKGROUND OF THE INVENTION

1. Field of the Invention

The present invention relates to a non-volatile memory integrated circuit device and a method of fabricating the same and, more particularly, to a non-volatile memory integrated circuit device and a method of fabricating the device, in which the amount of on-cell current during a read operation is increased.

2. Description of the Related Art

Non-volatile memory integrated circuit devices used in contactless smart cards, such as a credit card, an Identification (ID) card and a bank entry card, require high reliability, a short access time and low power consumption. Conventional non-volatile memory integrated circuit devices do not meet these requirements. For example, a flash memory cell having a NOR architecture employs Channel Hot Electron Injection (CHEI) at the time of programming and employs Fowler-Nordheim (FN) tunneling at the time of erasing, resulting in an over-erasing problem. Furthermore, a flash memory cell having a NAND architecture employs FN tunneling both at the time of programming and at the time of erasing, and thus requires a significantly high voltage.

To overcome these problems, a flash memory cell having two transistors (hereinafter referred to as a "2Tr flash memory cell") has been developed. In more detail, the 2Tr flash memory cell includes a memory transistor and a select transistor, which are connected in series. The memory transistor is connected to a bit line and the select transistor is connected to a common source. A floating junction is disposed between the memory transistor and the select transistor.

The 2Tr flash memory cell has a very short access time because it employs an NOR architecture. Furthermore, the over-erasing problem does not occur in the 2Tr flash memory cell because the select transistor is used. In addition, since program and erase operations are performed using FN tunneling, the current (or power) required at the time of programming or erasing can be reduced and high efficiency can be achieved using low voltage.

SUMMARY OF THE INVENTION

According to an aspect of the present invention, there is provided a non-volatile memory integrated circuit device including a semiconductor substrate having a plurality of substantially rectangular field regions arranged in a matrix form, the short and long sides of each of the substantially rectangular field regions being parallel to a row direction and a column direction of a matrix, respectively; word lines and select lines extending parallel to the row direction of the matrix on the semiconductor substrate, the word lines crossing the substantially rectangular field regions arranged in the row direction of the matrix, and the select lines partially overlapping the substantially rectangular field regions arranged in the row direction of the matrix, such that the overlapping parts of long sides of the substantially rectangular field regions and the overlapping short sides of the overlapping substantially rectangular field regions are located below the select lines; and a floating junction region formed within the semiconductor substrate between the word lines and the select lines, a bit line junction region formed opposite the floating junction region with respect to the word lines, and a common source region formed opposite the floating junction region with respect to the select lines.

In one embodiment, assuming that a length of an overlapping part of the long side of each of the overlapping substantially rectangular field regions is "a" and a depth of the substantially rectangular field region is "b", $a \leq b$.

In one embodiment, the semiconductor substrate is of a first conduction type, and includes a second conduction-type first well, which is formed within the semiconductor substrate, and a first conduction-type second well, which is formed within the first well. In one embodiment, the floating junction region, the bit line junction region, and the common source region are formed within the second well.

In one embodiment, each of the select lines has a stack structure in which a plurality of conductive films, which are electrically interconnected to each other, is stacked. In one embodiment, the conductive films are electrically interconnected to each other through a butting contact.

In one embodiment, the floating junction region is formed to be shallower than the bit line junction region and the common source region. In one embodiment, each of the bit line junction region and the common source region has a Light Doped Drain (LDD) structure, in which a low-concentration impurity is shallowly doped and a high-concentration impurity is deeply doped, and the floating junction region is shallowly doped with a low-concentration impurity.

According to another aspect of the present invention there is provided a non-volatile memory integrated circuit device including a semiconductor substrate having a plurality of first active regions extending in a first direction, and a plurality of second active regions extending in a second direction to cross the plurality of first active regions; a plurality of select lines and word lines extending in the first direction on the semiconductor substrate, wherein two select lines are arranged in each of the first active regions and two word lines are not arranged in each first active region but are arranged to cross the plurality of second active regions; and a common source region formed within a first active region between the two select lines, a bit line junction region formed within a second active region between the two word lines, and a floating junction region formed within a second active region between each of the select lines and each of the word lines.

In one embodiment, the semiconductor substrate is of a first conduction type, and includes a second conduction-type first well, which is formed within the semiconductor substrate, and a first conduction-type second well, which is formed within the first well. In one embodiment, the floating junction region, the bit line junction region, and the common source region are formed within the second well. In one embodiment, each of the select lines has a stack structure in which a plurality of conductive films, which are electrically interconnected to each other, is stacked. In one embodiment, the conductive films are electrically interconnected to each other through a butting contact.

In one embodiment, the floating junction region is formed to be shallower than the bit line junction region and the common source region. In one embodiment, each of the bit line junction region and the common source region has an LDD structure, in which a low-concentration impurity is shallowly doped and a high-concentration impurity is deeply doped, and the floating junction region is shallowly doped with a low-concentration impurity.

According to still another aspect of the present invention, there is provided a non-volatile memory integrated circuit device including a semiconductor substrate; and a non-volatile memory cell formed within the semiconductor substrate, the non-volatile memory cell comprising a memory transistor and a select transistor connected in series, the memory transistor including a bit line junction region, a memory gate and a floating junction region, the select transistor including the floating junction region, a select gate, and a common source region, and a channel width of the select transistor including a first channel width near the common source region and a second channel width near the floating junction region, the first channel width being wider the second channel width.

In one embodiment, the device further comprises a plurality of non-volatile memory cells adjacent to the non-volatile memory cell on the semiconductor substrate. Channels of the select transistors of the non-volatile memory cell and the neighboring non-volatile memory cells include first channels near the common source region and second channels near the floating junction region, respectively, the first channels are separated from each other by the field regions, the second channels are not separated by the field regions but are connected to each other.

In one embodiment, the semiconductor substrate is of a first conduction type, and includes a second conduction-type first well, which is formed within the semiconductor substrate, and a first conduction-type second well, which is formed within the first well. In one embodiment, the floating junction region, the bit line junction region, and the common source region are formed within the second well.

In one embodiment, the memory gate has a stack structure in which a floating gate and a control gate, which are electrically separated from each other, is stacked.

In one embodiment, each of the select lines has a stack structure in which a plurality of conductive films, which are electrically interconnected to each other, is stacked. In one embodiment, the conductive films are electrically interconnected to each other through a butting contact.

In one embodiment, the floating junction region is formed to be shallower than the bit line junction region and the common source region. In one embodiment, each of the bit line junction region and the common source region has an LDD structure, in which a low-concentration impurity is shallowly doped and a high-concentration impurity is deeply doped, and the floating junction region is shallowly doped with a low-concentration impurity.

According to still another aspect of the present invention, there is provided a non-volatile memory integrated circuit device including a first conduction-type semiconductor substrate; a second conduction-type first well formed within the semiconductor substrate; a first conduction-type second well formed within the first well; and a non-volatile memory cell formed within the second well, the non-volatile memory cell including a memory transistor and a select transistor connected to each other in series, a gate of the memory transistor having a stack structure in which a floating gate and a control gate electrically insulated are stacked, a gate of the select transistor having a stack structure in which a plurality of conductive films electrically connected are stacked, a floating junction region being formed within the semiconductor substrate between the gate of the memory transistor and the gate of the select transistor, a bit line junction region being formed opposite the floating junction region with respect to the gate of the memory transistor, a common source region being formed opposite the floating junction region with respect to the gate of the select transistor, a channel width of the select transistor including a first channel width near the common source region and a second channel width near the floating junction region, the first channel width being wider the second channel width.

In one embodiment, the device further comprises a plurality of non-volatile memory cells adjacent to the non-volatile memory cell on the semiconductor substrate. Channels of the select transistors of the non-volatile memory cell and the neighboring non-volatile memory cells include first channels near the common source region and second channels near the floating junction region, respectively, the first channels are separated from each other by the field regions, the second channels are not separated by the field regions but are connected to each other.

According to an aspect of the present invention, there is provided a method of fabricating a non-volatile memory integrated circuit device, the method including providing a semiconductor substrate in which a plurality of substantially rectangular field regions are arranged in a matrix form, a short side and a long side of each of the substantially rectangular field regions being parallel to a row direction and a column direction of a matrix, respectively; forming word lines and select lines extending parallel to the row direction of the matrix on the semiconductor substrate, wherein the word lines cross a plurality of substantially rectangular field regions arranged in the row direction of the matrix, the select lines partially overlap the substantially rectangular field regions arranged in the row direction of the matrix, such that overlapping parts of long sides of the substantially rectangular field regions and overlapping short sides of the substantially rectangular field regions are located below the select lines; and forming a floating junction region formed within the semiconductor substrate between the word lines and the select lines, a bit line junction region formed opposite the floating junction region with respect to the word lines, and a common source region formed opposite the floating junction region with respect to the select lines.

In one embodiment, assuming that a length of an overlapping part of the long side of each of the overlapping substantially rectangular field regions is "a" and a depth of the substantially rectangular field region is "b", $a \leq b$.

In one embodiment, the method further comprises forming a first well having a conductive type different from that of the semiconductor substrate within the semiconductor substrate, and a second well having a conductive type different from that of the first well within the first well. In one embodiment, the floating junction region, the bit line junction region, and the common source region are formed within the second well.

In one embodiment, forming the word lines and the select lines comprises: sequentially forming a first conductive film and a dielectric layer on the semiconductor substrate; primarily patterning the dielectric layer and the first conductive film to form a dielectric layer pattern and a first conductive film pattern; forming a second conductive film on a product of the first patterning; and secondarily patterning the second conductive film, the dielectric layer pattern, and the first conductive film pattern.

In one embodiment, forming the floating junction region, the bit line junction region, and the common source region comprises: implanting a low-concentration impurity with a low energy using the word lines and the select lines as masks; forming spacers on sidewalls of the word lines and the select lines; and implanting a high-concentration impurity with a high energy using the word lines and the select lines, in which the spacers are formed, as masks.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DESCRIPTION OF THE PREFERRED EMBODIMENTS

Merits and novel characteristics of the invention will become more apparent from the following detailed description and exemplary embodiments taken in conjunction with the accompanying drawings. However the present invention is not limited to the disclosed embodiments, but may be implemented in various manners. The embodiments are provided to complete the description of the present invention and to allow those having ordinary skill in the art to understand the scope of the present invention. The present invention is defined by the claims. The same reference numbers will be used throughout the drawings to refer to the same or like parts.

The present invention will now be described in detail in connection with preferred embodiments with reference to the accompanying drawings.

Figure 1:
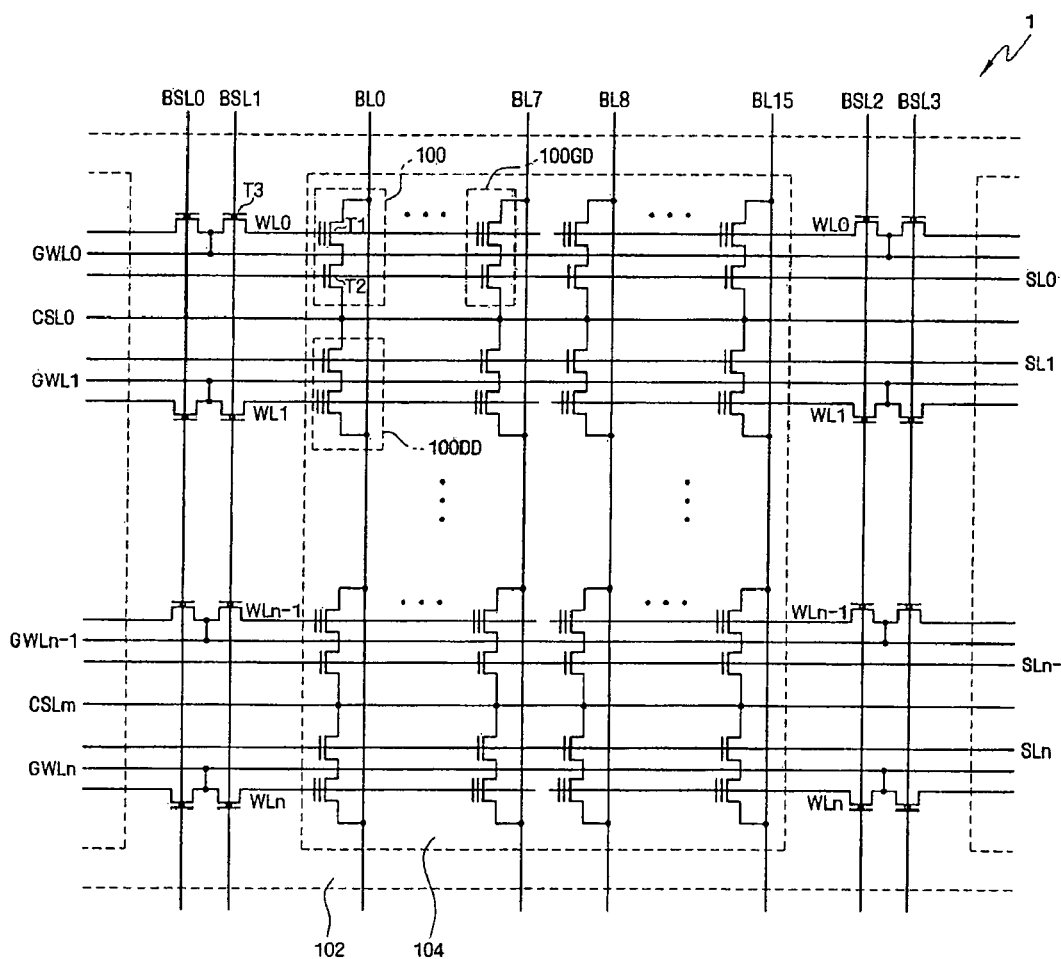
FIG. 1 is a circuit diagram of a non-volatile memory integrated circuit device according to embodiments of the present invention.

FIG. 1 is a circuit diagram of a non-volatile memory integrated circuit device according to embodiments of the present invention.

Referring to FIG. 1, in the non-volatile memory integrated circuit device 1 according to the embodiments of the present invention, cell blocks are arranged in a repeating manner. In each of the cell blocks, a plurality of non-volatile memory cells 100, 100GD, and 100DD are arranged according to a NOR architecture, Each of the non-volatile memory cells 100, 100GD, and 100DD includes a memory transistor T1, composed of a floating gate and a control gate, and a select transistor T2 composed of a select gate. The control gates of a plurality of memory transistors T1 located along the same row are interconnected by one of word lines WL0 to WLn, and the select gates of a plurality of select transistors T2 located along the same row are interconnected by one of select lines SL0 to SLn. Furthermore, a plurality of memory transistors T1 located along the same column can be connected by one of bit lines BL0 to BL15. A plurality of select transistors T2 is interconnected by common source lines CSL0 to CSLm. The common source lines CSL0 to CSLm may be constructed to be each shared by each row, each pair of rows, or each cell block.

Global word lines GWL0 to GWLn are selectively connected to the word lines WL0 to WLn, which are arranged in respective cell blocks, through a plurality of bite select transistors T3. The gates of the plurality of bite select transistors T3 located along the same column are interconnected by one of bite select lines BSL0 to BSL3.

However, with reference to FIGS. 1 and 2A-2D, in the non-volatile memory integrated circuit device 1 according to the embodiments of the present invention, a second conduction-type (for example, an N-type) first well 102 may be formed within a first conduction-type (for example, a P-type) semiconductor substrate, and a first conduction-type (for example, a P-type) second well 104 may be formed within the first well 102. In this case, the cell blocks may be formed within the second well 104 and the bite select transistors T3 may be formed within the first well 102.

Figure 2A:
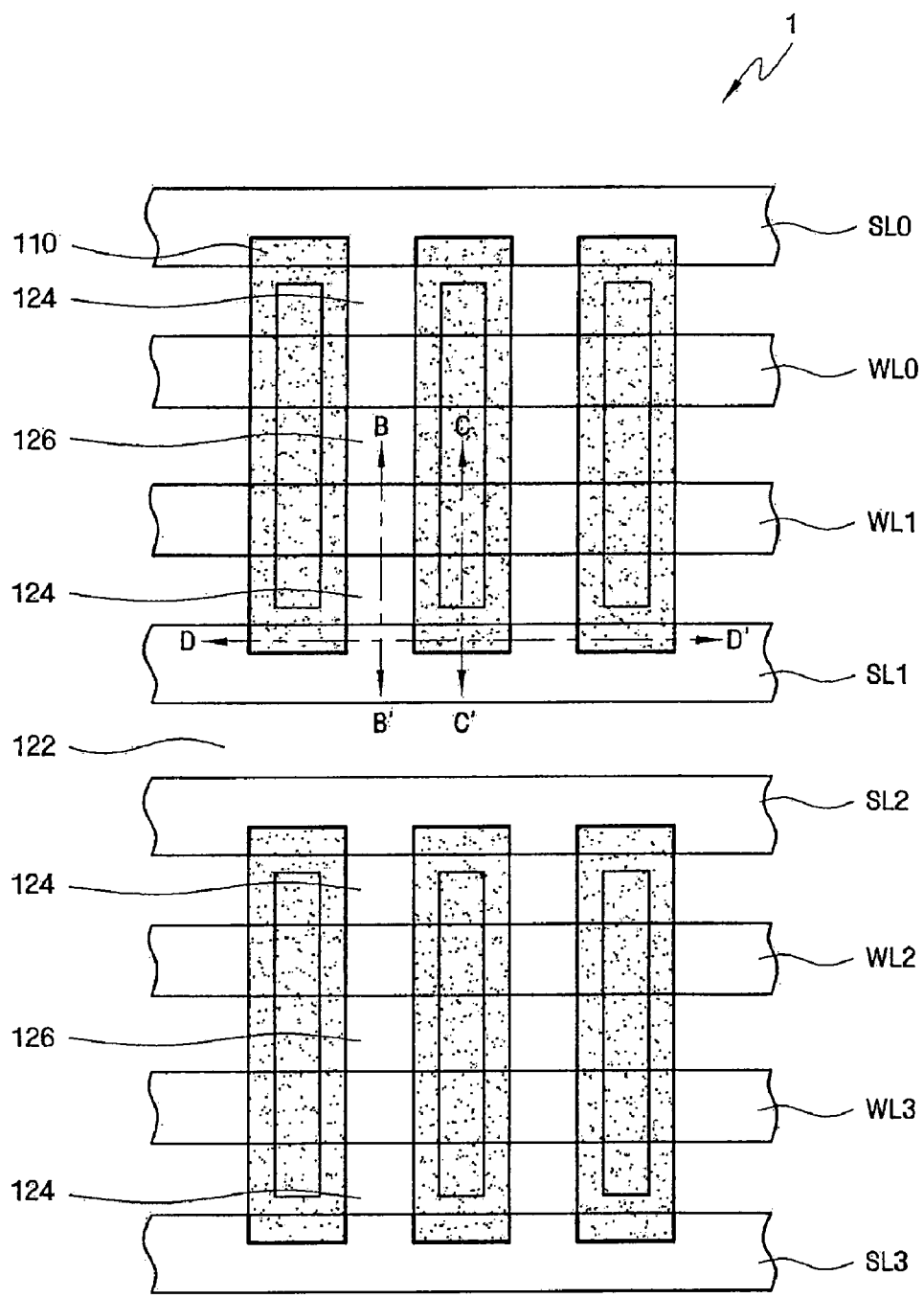
FIG. 2A is a layout diagram of a non-volatile memory integrated circuit device according to an embodiment of the present invention.
Figure 2B:
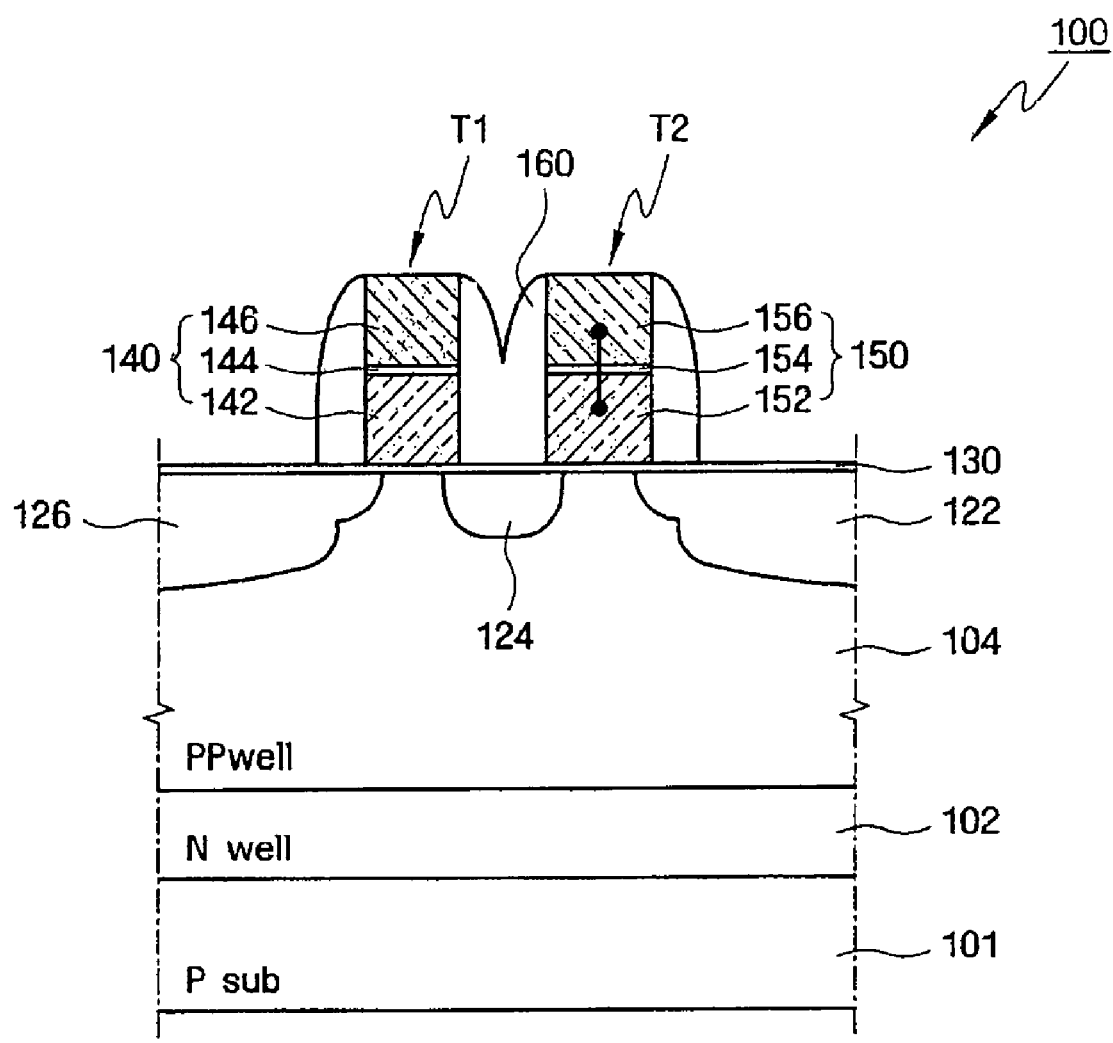
FIGS. 2B to 2D are sectional views of the non-volatile memory integrated circuit device of FIG. 2A taken along lines B-B', C-C' and D-D' of FIG. 2A, respectively.
Figure 2C:
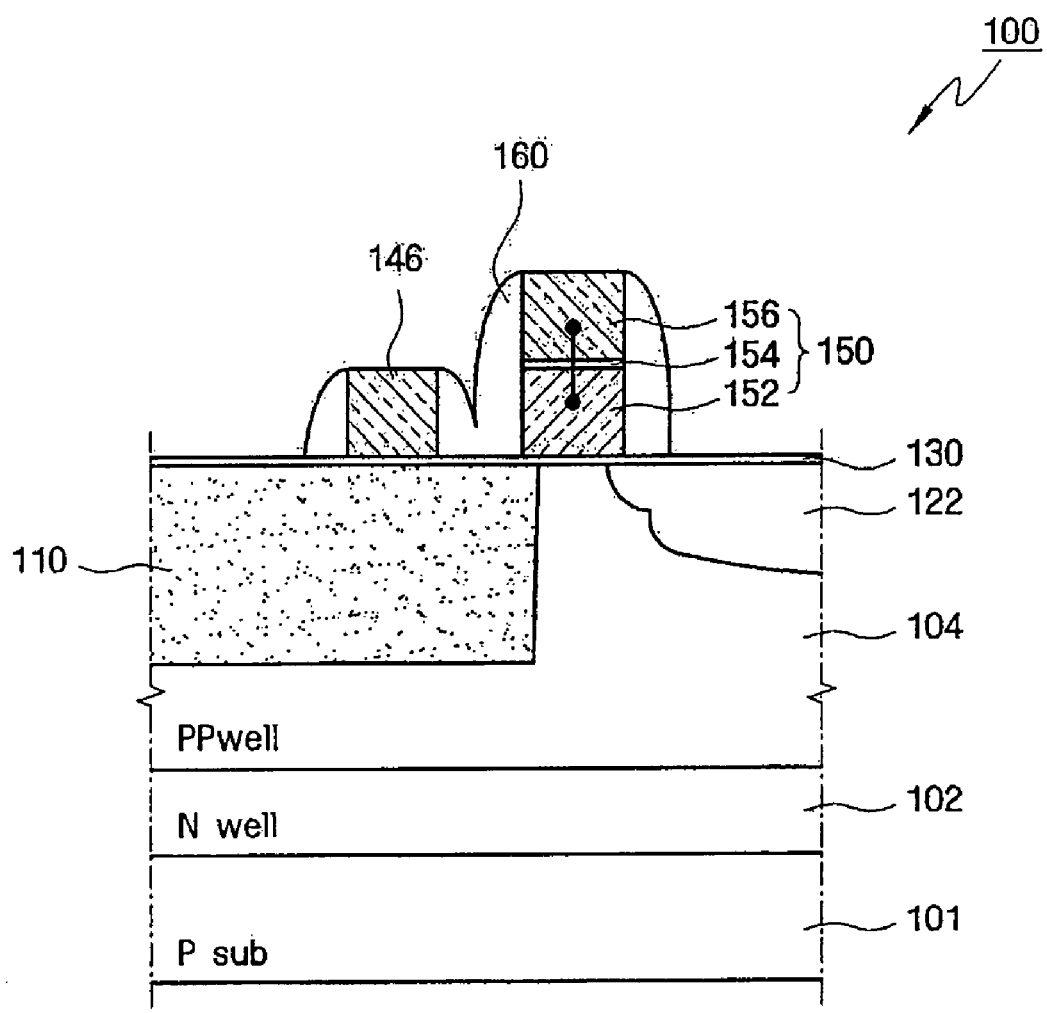
Figure 2D:
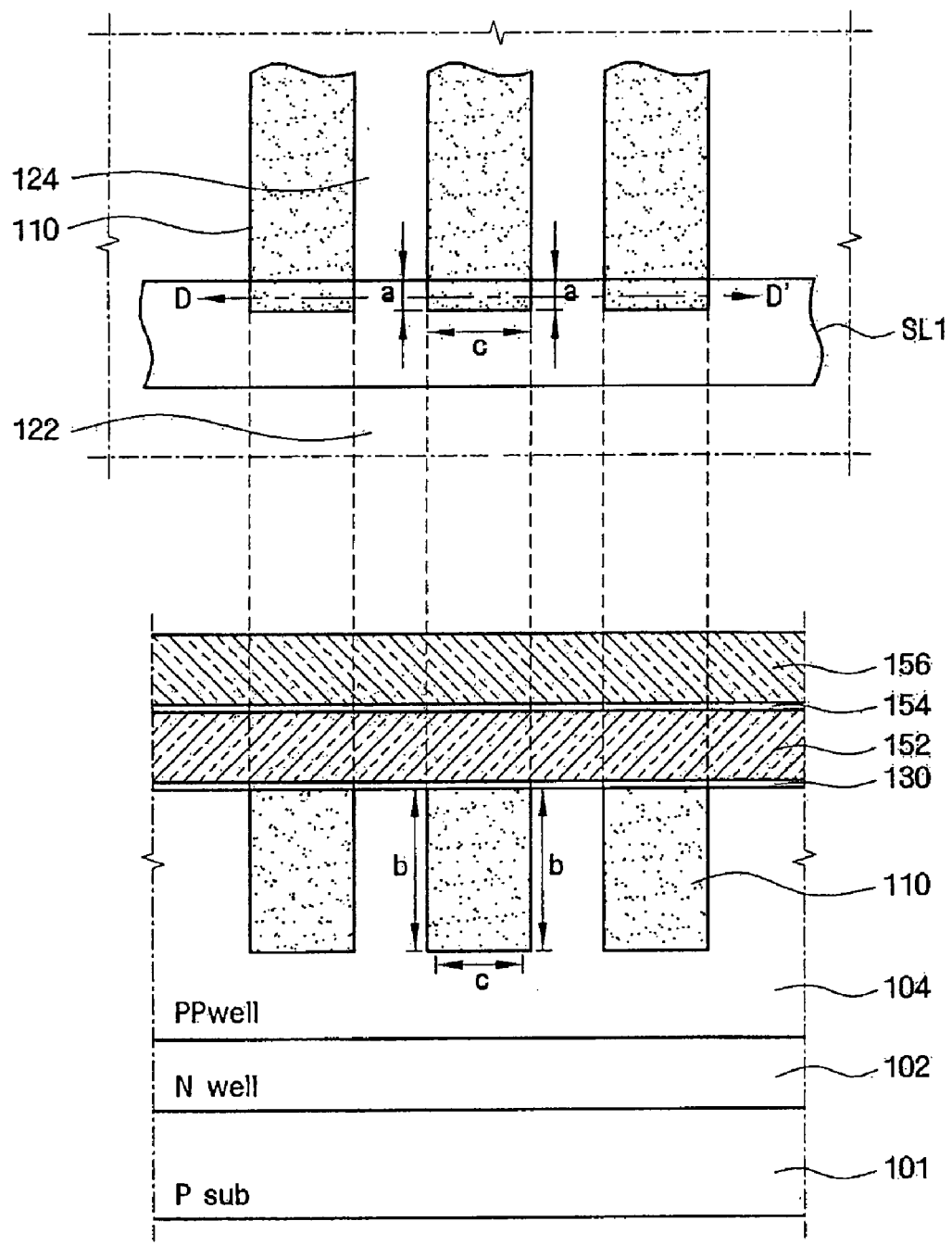
Figure 3:
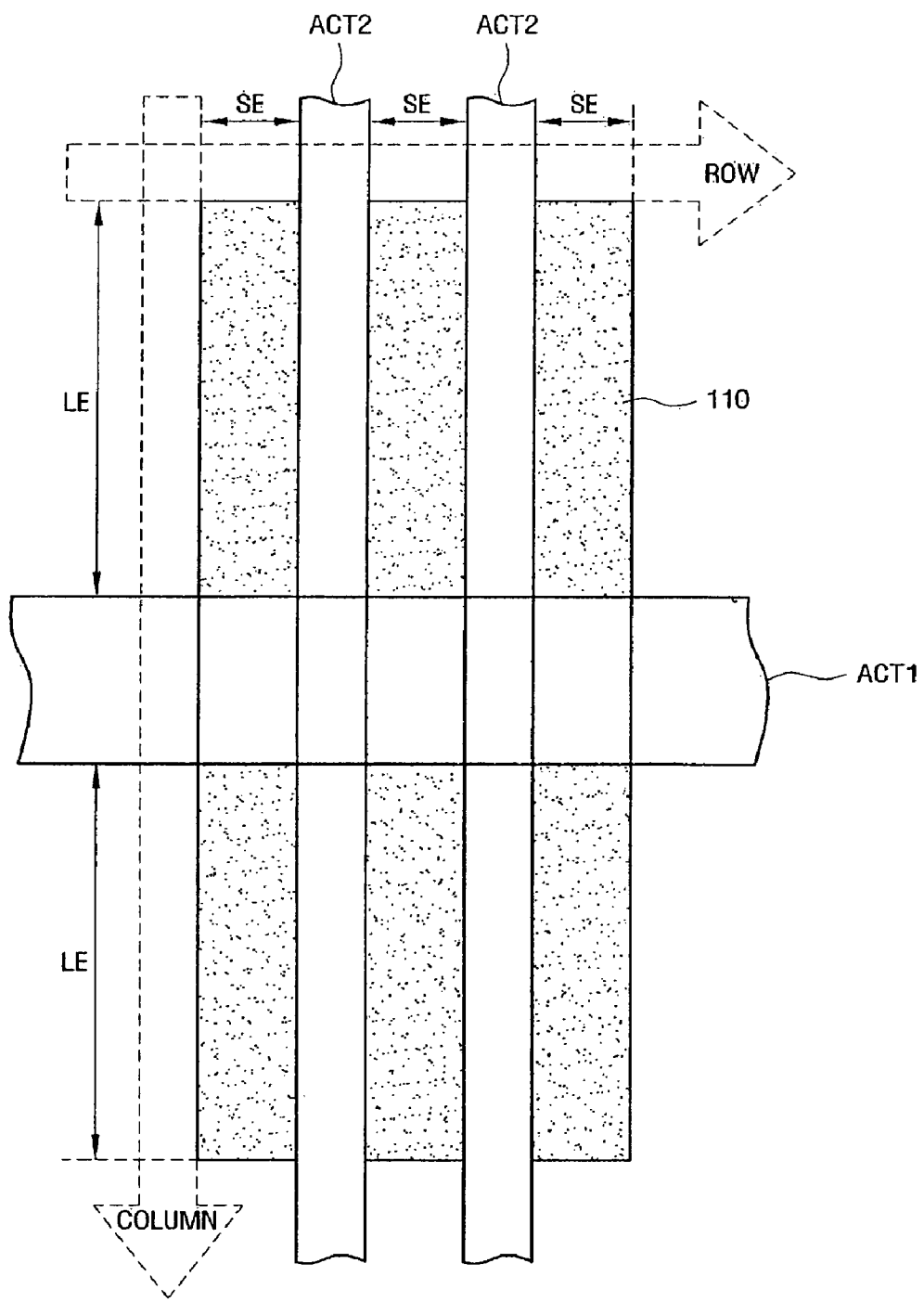
FIG. 3 is a detailed schematic plan view illustrating active regions of the device of FIG. 2A.
Figure 4:
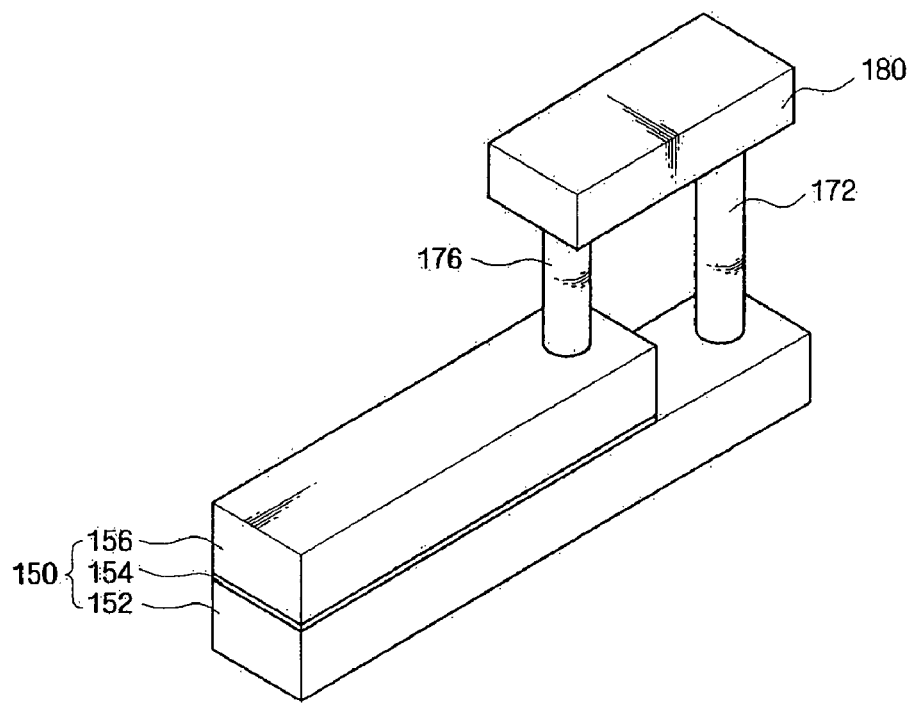
FIG. 4 is a perspective view illustrating the select gate of the non-volatile memory cell of a non-volatile memory integrated circuit device according to an embodiment of the present invention.

FIG. 2A is a layout diagram of a non-volatile memory integrated circuit device according to an embodiment of the present invention. FIGS. 2B to 2D are sectional views of the non-volatile memory integrated circuit device taken along lines B-B', C-C', and D-D' of FIG. 2A, respectively. FIG. 3 is a diagram illustrating the active regions of FIG. 2A. FIG. 4 is a perspective view illustrating the select gate of the non-volatile memory cell of a non-volatile memory integrated circuit device according to an embodiment of the present invention. FIG. 2D shows both a part of the layout diagram of FIG. 2A and the sectional view of the non-volatile memory integrated circuit device taken along line D-D', for convenience of description.

Referring first to FIGS. 2A and 3, in the non-volatile memory integrated circuit device 1 according to the embodiment of the present invention, a plurality of substantially rectangular field regions 110 is arranged on a semiconductor substrate in a matrix form, thus defining active regions ACT1 and ACT2.

The term "substantially rectangular" generally refers to a rectangle, but is used to include a polygon some or all of the four corners of which are chamfered for the efficiency of layout. The chamfering may be performed not only along a straight line, but also along a curved line.

Furthermore, as shown in FIG. 3, the short side SE and long side LE of each of the substantially rectangular field regions 110 may be arranged parallel to the row direction ROW and column direction COLUMN of a matrix, respectively.

A plurality of first active regions ACT1, extending in the row direction ROW, and a plurality of second active regions ACT2, extending in the column direction COLUMN to cross the plurality of first active regions ACT1, are defined by the substantially rectangular field regions 110.

The word lines WL0, WL1, WL2, and WL3 and the select lines SL0, SL1, SL2, and SL3, extending parallel to the row direction ROW, are arranged on the semiconductor substrate in which the plurality of substantially rectangular field regions 110 is formed.

In more detail, two word lines WL0 and WL1, or WL2 and WL3 cross the plurality of substantially rectangular field regions 110, respectively, which are arranged in the row direction ROW of the matrix. Furthermore, two select lines SL0 and SL1, or SL2 and SL3 partially overlap the plurality of substantially rectangular field regions 110, which are arranged in the row direction ROW of the matrix. Accordingly, overlapping parts of the long sides LE of the substantially rectangular field regions 110 and the overlapping short sides SEs of the substantially rectangular field regions 110 are disposed below the select lines SL0, SL1, SL2, and SL3.

That is, two select lines (for example, SL1 and SL2) are arranged in each first active region ACT1 and two word lines WL0 and WL1, or WL2 and WL3 are arranged not in each first active region ACT1, but are arranged to cross the plurality of second active regions ACT2.

Furthermore, a common source region 122 is formed within the first active region ACT1 between two select lines SL1 and SL2. A bit line junction region 126 is formed within the second active region ACT2 between two word lines WL0 and WL1, or WL2 and WL3. A floating junction region 124 is formed within the second active region ACT2 between each of the select lines SL0, SL1, SL2, and SL3 and each of the word lines WL0, WL1, WL2, and WL3.

The non-volatile memory integrated circuit device of the present invention is described with reference to sectional views (FIGS. 2B to 2D), which are taken along various lines of FIG. 2A in several directions, as previously noted.

Referring to FIGS. 2B and 2D, the non-volatile memory cell 100 of the non-volatile memory integrated circuit device (refer to 1 of FIG. 2A) of the present invention includes the semiconductor substrate 101, the first well 102, the second well 104, the memory transistor T1, and the select transistor T2.

The second conduction-type (for example, the N-type) first well 102 is formed within the first conduction-type (for example, the P-type) semiconductor substrate 101. The first conduction-type (for example, the P-type) second well 104 is formed within the first well 102.

The semiconductor substrate 101 may be a silicon substrate, a Silicon On Insulator (SOI) substrate, a GaAs substrate, a SiGe substrate, a ceramic substrate, or a quartz substrate. For example, the semiconductor substrate 101 may be a single crystalline silicon substrate doped with a P-type impurity. The concentration of the P-type impurity may be in the range from about $10^{14}$ to about $10^{15}$ atoms/cm$^3$. Furthermore, the concentration of the N-type impurity of the first well 102 may be in the range from about $10^{15}$ to about $10^{16}$ atoms/cm$^3$, and the concentration of the P-type impurity of the second well 104 may be in the range from about $10^{16}$ to about $10^{17}$ atoms/cm$^3$.

A field region is formed within the semiconductor substrate 101, thus defining the active region. The field region may be generally made of Field Oxide (FOX) using a Shallow Trench Isolation (STI) or Local Oxidation of Silicon (LOCOS) method.

The memory transistor T1 and the select transistor T2 are formed within the second well 104. In one embodiment, the memory transistor T1 and the select transistor T2 respectively include a memory gate 140 and a select gate 150, which are formed on a tunneling dielectric layer 130. In this case, the memory gate 140 is a stack-type gate in which a floating gate 142, an inter-gate dielectric layer 144, and a control gate 146 are stacked one on top of another. The select gate 150 is a stack-type gate in which conductive films 152 and 156 are stacked one on top of another. A dielectric layer 154 is interposed between the plurality of conductive films 152 and 156. A spacer 160 may also be selectively formed between the sidewalls of the memory gate 140 and select gate 150.

The tunneling dielectric layer 130 may be a single film made of $SiO_2$, SiON, $La_2O_3$, $ZrO_2$ or $Al_2O_3$, or a stack or combination film made of $SiO_2$, SiON, $La_2O_3$, $ZrO_2$ and $Al_2O_3$. The thickness of the tunneling dielectric layer 130 may be about 60 to 100 Å, for example, 65 to 75 Å, but is not limited thereto. The tunneling dielectric layer 130 is fabricated so that the non-volatile memory cell 100 can programmed and/or erased through FN tunneling.

The floating gate 142 is formed on the tunneling dielectric layer 130, and may be formed of a polycrystalline silicon film doped with an impurity. The thickness of the floating gate 142 may be about 1000 to 3000 Å, but is not limited thereto. The floating gate 142 serves to store electrical charges that determine the logic state of the non-volatile memory integrated circuit device.

The inter-gate dielectric layer 144 is formed on the floating gate 142, and may be a single film formed of an oxide film or a nitride film, or a stack or mixed film formed of an oxide film and a nitride film. For example, a stack film formed of an oxide film, a nitride film and an oxide film (a so-called "ONO film") may be generally used as the inter-gate dielectric layer 144. The lower oxide film may have a thickness of 100 Å, the nitride film may have a thickness of 100 Å, and the upper oxide film may have a thickness of 40 Å.

The control gate 146 is formed on the inter-gate dielectric layer 144. Although not shown in the drawings, a capping film may be further formed on the top of the control gate 146.

The plurality of conductive films 152 and 156 of the select gate 150 may be formed to have the same thicknesses and use the same materials as those of the floating gate 142 and the control gate 146, respectively.

However, referring to FIG. 2C, it can be seen that, under the select gate 150, the field region 110 is located only on one side and the active region is located on the other side (the side on which the common source region 122 is formed). The reason for this is that, as described above, the select lines SL0, SL1, SL2, and SL3 are arranged to partially overlap the plurality of substantially rectangular field regions 110 arranged in the row direction ROW of a matrix, as shown in FIG. 2A.

Referring to FIGS. 2B and 2C again, the floating junction region 124 is located within the semiconductor substrate 101 between the memory gate 140 and the select gate 150. The bit line junction region 126 is located opposite the floating junction region 124 with respect to the memory gate 140. The common source region 122 is located opposite the floating junction region 124 with respect to the select gate 150. Although, in the drawings, the bit line junction region 126 and the common source region 122 are illustrated as having a Lightly Doped Drain (LDD) structure, in which a low-concentration impurity is shallowly doped and a high-concentration impurity is deeply doped, and the floating junction region 124 is shallowly doped only with a low-concentration impurity, the present invention is not limited thereto. For example, the floating junction region 124 may also have an LDD structure, and the bit line junction region 126 and the common source region 122 may be shallowly doped only with a low-concentration impurity.

Referring to FIG. 2D, the select line SL1 partially-overlaps the plurality of substantially rectangular field regions 110 arranged in the row direction of the matrix, therefore overlapping parts of the long sides of the substantially rectangular field regions 110 and the overlapping short sides of the substantially rectangular field regions 110 are located below the select line SL1.

Assuming that the length of an overlapping part of the long side of the substantially rectangular field region 110 is "a", the length of the short side of the substantially rectangular field region 110 is "c", and the depth of the substantially rectangular field region 110 is "b", the following equation may be satisfied.

$$2b+c \geq 2a+c \therefore b \geq a \qquad (1)$$

Although, as in the present embodiment, the select line SL1 and the field region 110 partially overlap each other, the field region 110 must electrically separate the floating junction regions 124 between neighboring non-volatile memory cells.

In Equation 1, "2b+c" and "2a+c" denote the vertical distance and the horizontal distance between neighboring floating junction regions 124, respectively. From Equation 1, it can be seen that the horizontal distance may not be greater than the vertical distance. The reason for this is because it is common to secure sufficient depth of the field region, thereby enabling vertical separation between the floating junction regions 124.

Furthermore, assuming that the vertical depth of the field region 110 is constant, in the case where the floating junction region 124 is formed to be thinner than each of the bit line junction region 126 and the common source region 122, as shown in FIGS. 2B and 2C, vertical separation can be achieved readily, compared to the case where the floating junction regions 124 are formed to be deep, like the bit line junction region 126 and the common source region 122. The reason for this is because the vertical distance between the neighboring floating junction regions 124 is greater in the former case.

The plurality of conductive films 152 and 156 of the select gate 150 may be electrically connected to each other using a butting contact, as shown in FIG. 4. That is, a contact 172 connected to the conductive film 152 and a contact 176 connected to the conductive film 156 can be connected to the same metal line 180 such that the same electrical signal can be applied to the plurality of conductive films 152 and 156.

The operation of the above-mentioned non-volatile memory integrated circuit device is described with reference to FIGS. 1 and 2B and Table 1 below.

Table 1 shows a list of operating voltages during the respective operations of the non-volatile memory integrated circuit device. It is to be understood that Table 1 illustrates only exemplary operating voltages, and that the present invention does not exclude other operating voltages.

TABLE 1

|  |  | Word Line | Select Line | Bit Line | Common Source | Second Well |
|---|---|---|---|---|---|---|
| Program | Select | 10 V | −7 V | −7 V | floating | −7 V |
|  | Non-select | 0 V | −7 V | 0 V | floating | −7 V |
| Erase | Select | −10 V | 0 V | floating | floating | 7 V |
|  | Non-select | 0 V | 0 V | floating | floating | 7 V |
| Read | Select | 2 V | 2 V | 0.5 V | 0 V | 0 V |
|  | Non-select | 0 V | 0 V | 0 V | 0 V | 0 V |

The program operation is an operation of charging the floating gate 142 of the memory transistor T1 with electrical charges that determine the logic state. Since the program mechanism employs FN tunneling, the bit line BL0 coupled to a non-volatile memory cell 100 selected to be programmed is set at a low level (for example, −7V), the word line WL0 is set at a high level (for example, 10V), and the second well 104 is supplied with a low voltage (for example, −7V). Accordingly, a charging path for electrical charges is formed between the bit line junction 126 and floating gate 142 of the selected non-volatile memory cell 100 and between the second well 104 and the floating gate 142. Furthermore, the select line SL0 is supplied with a low level voltage (for example, −7V), thereby preventing the floating junction 124 and the common source 122 from being electrically connected to each other.

In contrast, the non-selected non-volatile memory cell 100GD sharing the same word lines WL0 with the selected non-volatile memory cell 100 may be unintentionally programmed by a gate disturb phenomenon. To prevent such unintentional programming, the bit line BL7 coupled to the non-selected non-volatile memory cell 100GD is supplied with, for example, 0V.

Furthermore, the non-selected non-volatile memory cell 100DD that shares the same bit line with the selected non-volatile memory cell 100 may be unintentionally programmed by a drain disturbance phenomenon. To prevent such unintentional programming, the word line WL1 coupled to the non-selected non-volatile memory cell 100DD is supplied with, for example, 0V.

The erase operation is an operation of discharging electrical charges from the floating gate 142 of the memory transistor T1. For example, eight non-volatile memory cells 100 to 100GD (eight non-volatile memory cells constitute a unit, that is, a byte unit) may be erased at the same time, but the present invention is not limited thereto. Since an erase mechanism employs FN tunneling, the word line WL0 coupled to the eight non-volatile memory cells 100 to 100GD selected to be erased is set at a low level (for example, −10V), the second well 104 is supplied with a high voltage (for example, 7V), and the bit lines BL0 to BL7 are floated. Therefore, a discharge path for electrical charges is formed between the floating gates 142 of the selected eight non-volatile memory cells 100 to 100GD and the second well 104.

The read operation is an operation of determining a logic state depending on whether the floating gate 142 of the memory transistor T1 has been charged with electrical charges. The word line WL0 coupled to the selected non-volatile memory cell 100 is supplied with 2V, the bit line BL0 is supplied with 0.5V, and the select line SL0 is supplied with 2V. Whether a current (hereinafter referred to as "on-cell current") path from the bit line BL0 through the memory transistor T1 and the select transistor T2 to the common source region 122 has been created is determined depending on whether the floating gate 142 has been charged with electric charges.

Figure 5:
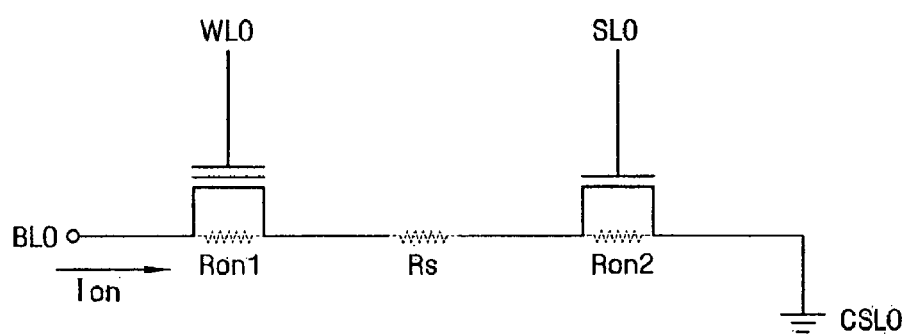
FIG. 5 is a view illustrating the read operation of the non-volatile memory cell of the non-volatile memory integrated circuit device according to embodiments of the present invention.

The read operation will be described in more detail with reference to FIG. 5. From FIG. 5, it can be seen that the on-cell current Ion is determined by the resistance Ron1 of the memory transistor T1 of the selected non-volatile memory cell 100, the resistor Rs of the floating junction, and the resistor Ron2 of the select transistor T2. That is, the amount of the on-cell current Ion can be increased by lowering the resistance values of the resistors Ron1, Rs, and Ron2. In the non-volatile memory integrated circuit device 1 according to the embodiments of the present invention, the non-volatile memory cell 100 increases the amount of on-cell current Ion by lowering the resistance value of the resistor Ron2 of the select transistor T2. That is, the amount of on-cell current Ion can be increased by enhancing the driving ability of the select transistor T2.

Figure 6:
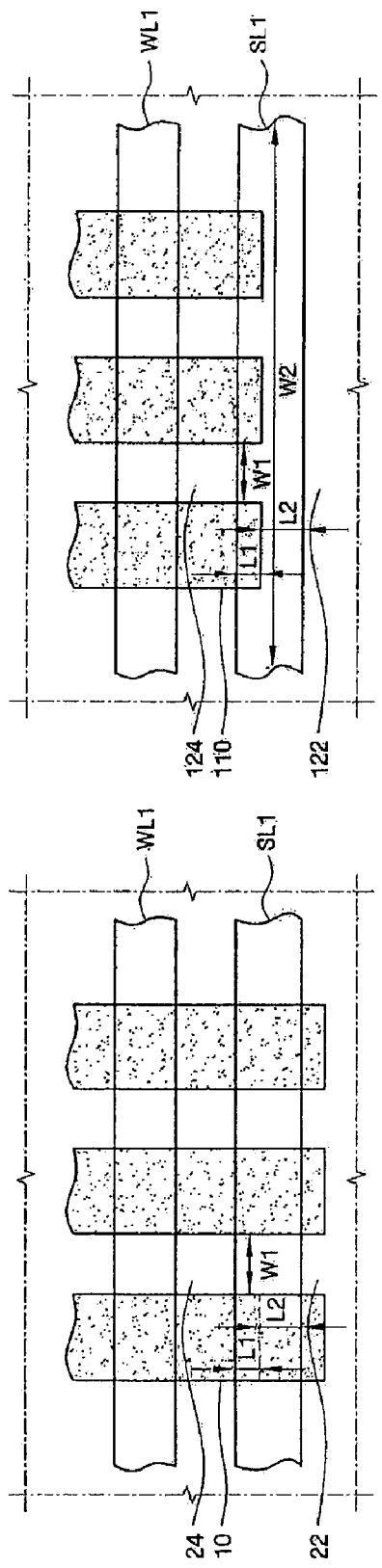
FIG. 6 is a layout diagram of the conventional non-volatile memory integrated circuit device and the non-volatile memory integrated circuit device according to an embodiment of the present invention.

FIG. 6 is a layout diagram of part of the conventional non-volatile memory integrated circuit device and part of the non-volatile memory integrated circuit device according to the embodiment of the present invention.

Referring to FIG. 6, the driving ability of the select transistor of the non-volatile memory cell according to the present invention is much greater than that of the select transistor of the conventional non-volatile memory cell.

In the conventional non-volatile memory cell, the select line SL1 crosses the plurality of substantially rectangular field regions 10 arranged in the row direction ROW of the matrix, as shown in the left side view of FIG. 6, whereas in the non-volatile memory cell of the present invention, the select line SL1 partially overlaps the plurality of substantially rectangular field regions 110 arranged in the row direction ROW of the matrix, as shown in the right side view of FIG. 6.

In this case, the current driving ability of the conventional select transistor and the current driving ability of the select transistor of the present invention can be expressed by the following Equations 2 and 3, respectively. In the conventional case, the channel width is constant (i.e., W1), but in the present invention, the channel width is not constant. That is, in the select transistor of the present invention, the channel width W2 near a common source region is wider than the channel width W1 near a floating junction region. In comparing Equation 2 and Equation 3, the second term of Equation 3 is greater than the second term of Equation 2. Therefore, in the present invention, the driving ability of the select transistor of the non-volatile memory cell is significantly greater than that of the select transistor of the conventional non-volatile memory cell.

$$Ion \propto \frac{W1}{L1} + \frac{W1}{L2} \quad (2)$$

$$Ion \propto \frac{W1}{L1} + \frac{W2}{L2} \quad (3)$$

In the present invention, channels near the floating junction regions 124 of the select transistors of a plurality of neighboring non-volatile memory cells are separated from each other by the field regions 110, and channels near the common source region 122 are connected without being separated by the field regions 110. However, the present invention is not limited thereto.

Furthermore, the non-volatile memory integrated circuit device of the present invention may not increase the size of a layout compared to the conventional device. Conventionally, in order to increase the driving ability of a transistor, it is common to use a method of increasing the channel width of the transistor. However, in the present invention, the layout is changed such that the select line SL0 partially overlaps the plurality of substantially rectangular field regions 110 arranged in the row direction ROW of the matrix. Accordingly, the driving ability of the select transistor can be improved without increasing the size of the layout.

Figure 7:
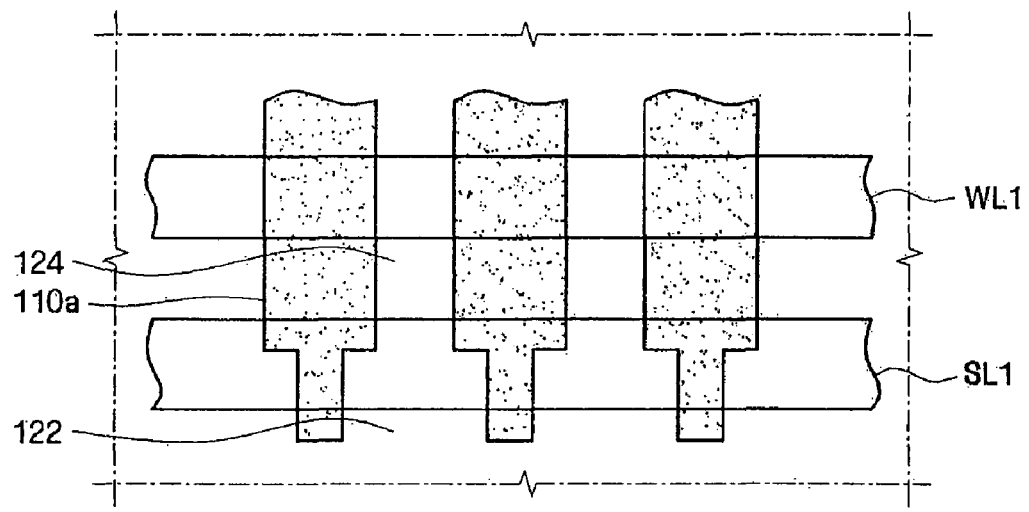
FIG. 7 is a layout diagram of a non-volatile memory integrated circuit device according to another embodiment of the present invention.

FIG. 7 is a layout diagram of a non-volatile memory integrated circuit device according to another embodiment of the present invention.

Referring to FIG. 7, the non-volatile memory integrated circuit device of FIG. 7 is substantially the same as that of FIG. 2 except that field regions 110a are modified and completely cross the select line SL1. The channel width of the select transistor including a first channel width near the common source region 122 and a second channel width near the floating junction region 124, the first channel width is wider the second channel width. In this case, the driving ability of the select transistor can be enhanced compared to the conventional transistor, and the characteristic of separation between the neighboring floating junction regions 124 can be maintained at the same level.

Figure 8:
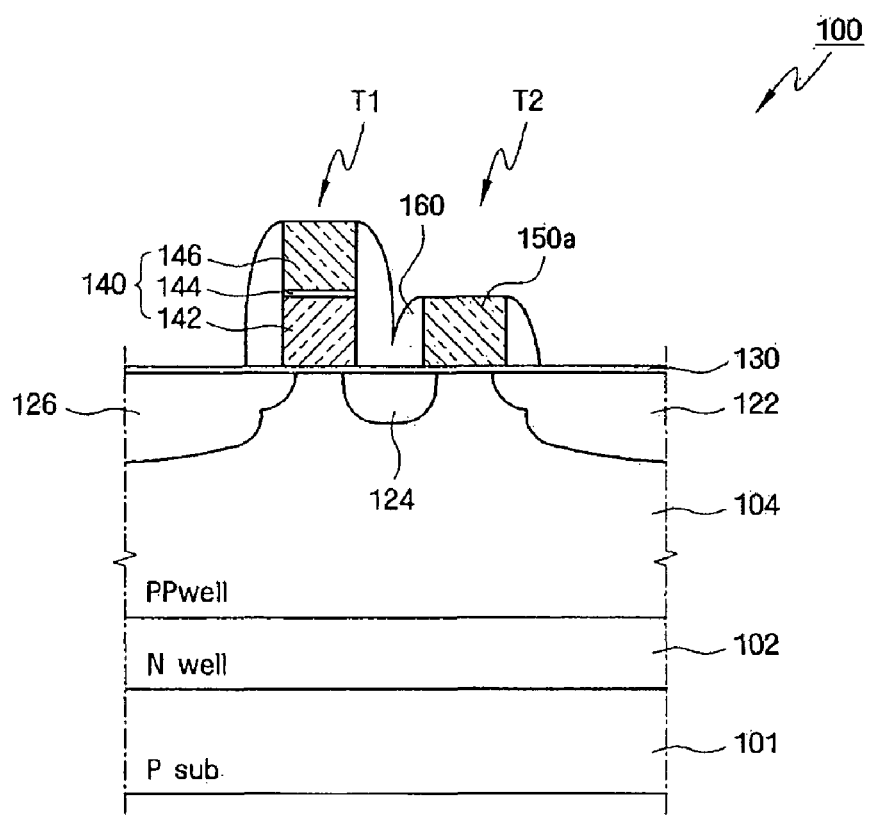
FIG. 8 is a sectional view of a non-volatile memory integrated circuit device according to still another embodiment of the present invention.

FIG. 8 is a sectional view of a non-volatile memory integrated circuit device according to still another embodiment of the present invention.

The non-volatile memory integrated circuit device of FIG. 8 is substantially the same as that of FIG. 2B except that a select gate 150a is not of a stack gate type, but of a single gate type.

The modified embodiments shown of FIGS. 7 and 8 may be used separately or in combination. For example, the select gate 150a may be of a single gate type as shown in FIG. 8 while the field region 110a is modified as shown in FIG. 7.

FIGS. 9A to 11C are diagrams illustrating a method of fabricating a non-volatile memory cell constituting part of the non-volatile memory integrated circuit device according to an embodiment of the present invention.

Figure 9A:
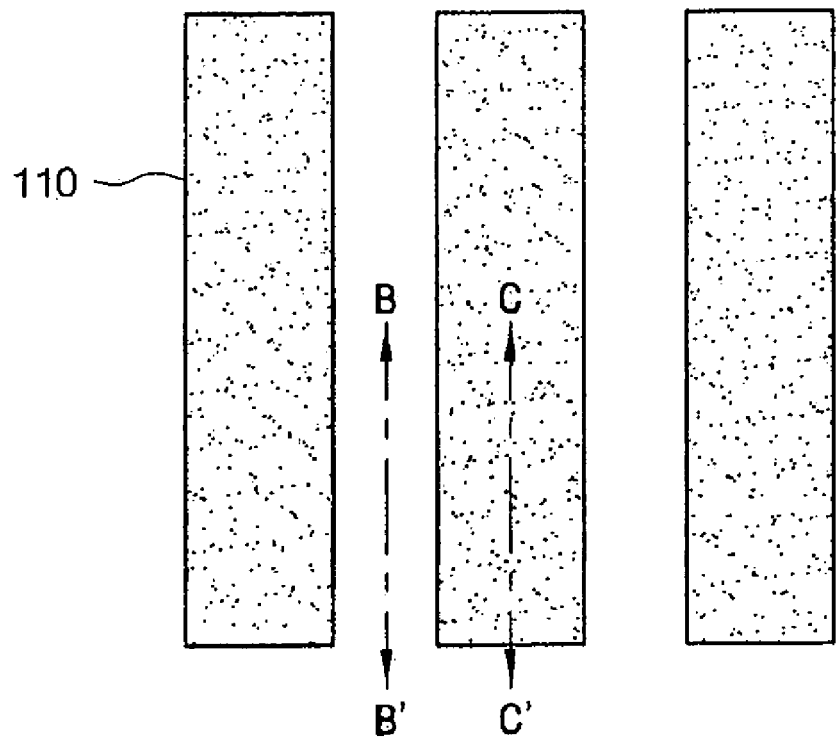
FIGS. 9A to 9C are views illustrating a method of fabricating a non-volatile memory cell constituting the non-volatile memory integrated circuit device according to an embodiment of the present invention.
Figure 9A:
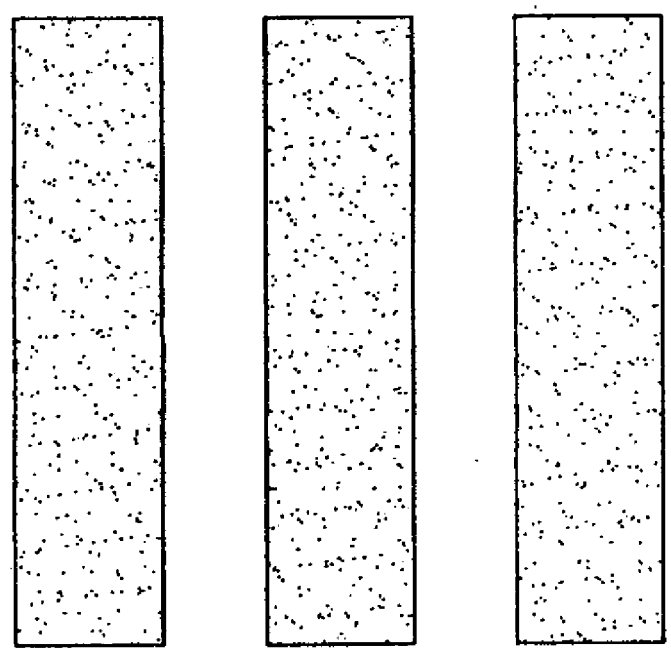
Figure 9B:
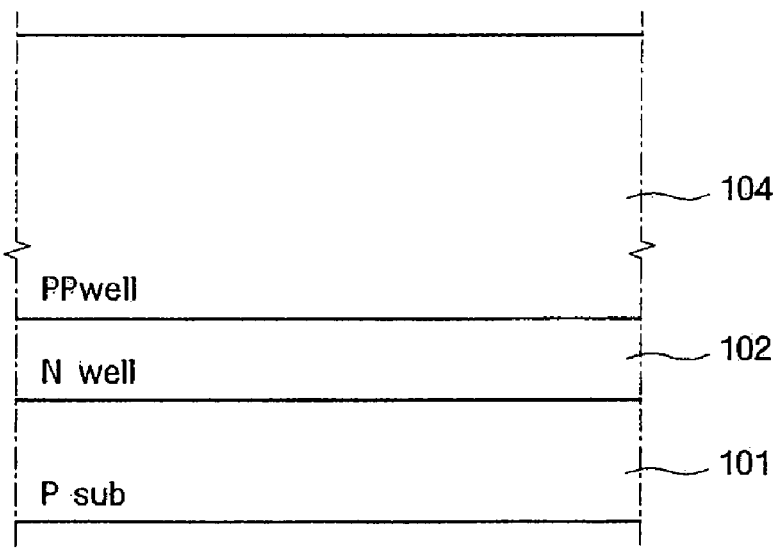
Figure 9C:
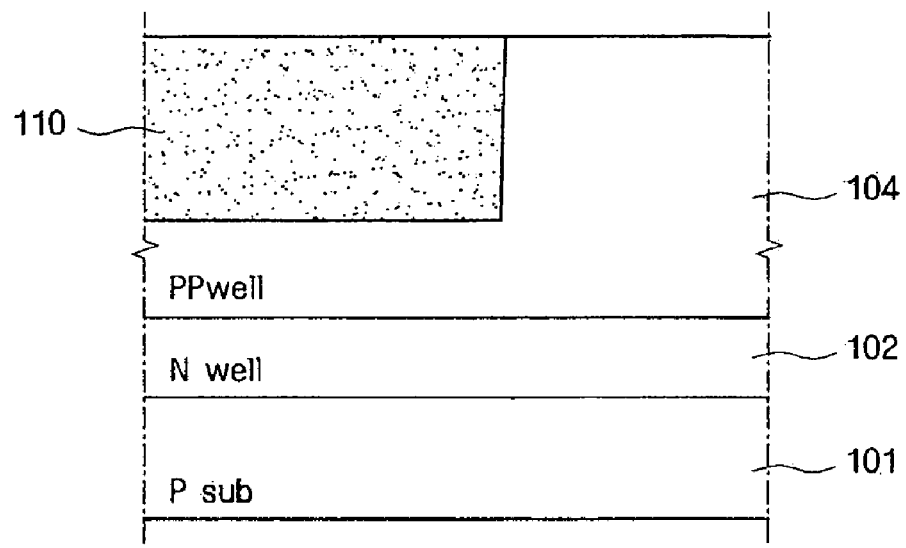

Referring to FIGS. 9A and 9C, an N-type first well 102 is formed within a P-type semiconductor substrate 101. The first well 102 may be formed using diffusion or ion implantation such that an N-type impurity has a concentration from about $10^{16}$ to about $10^{18}$ atoms/cm$^3$.

Thereafter, a P-type second well 104 is formed within the first well 102. The second well 104 may be formed using diffusion or ion implantation, such that a P-type impurity has a concentration from about $10^{17}$ to about $10^{18}$ atoms/cm$^3$.

A plurality of substantially rectangular field regions 110 is formed within the semiconductor substrate 101 in a matrix form, thus defining active regions. In this case, the substantially rectangular field regions 110 are arranged such that the short side of each thereof and the long side of each thereof are aligned parallel to the row and column directions of a matrix, respectively.

Figure 10A:
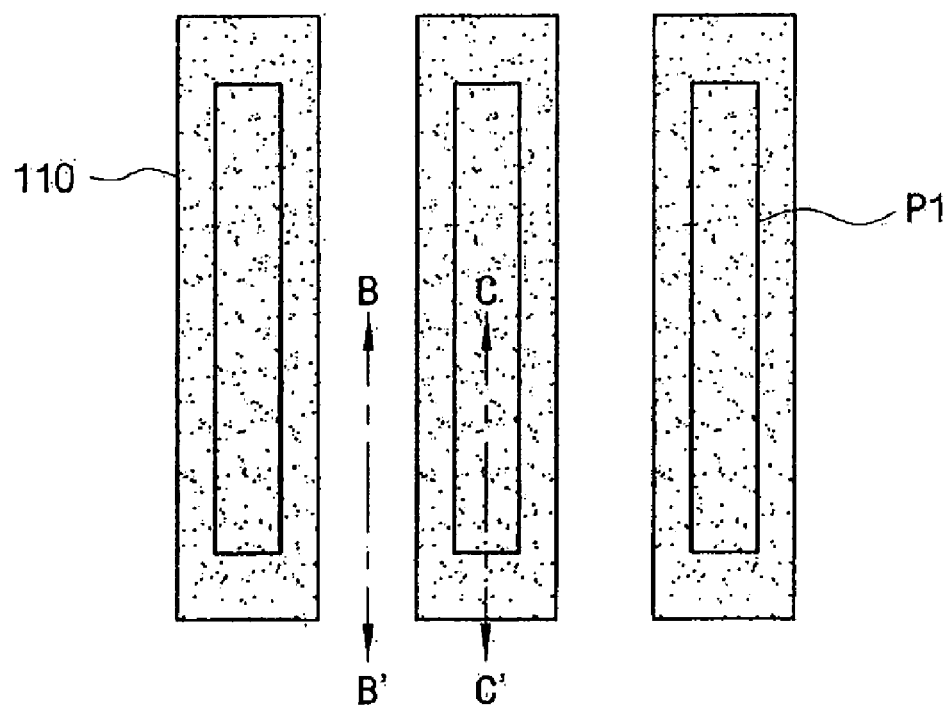
FIGS. 10A to 10C are views illustrating a method of fabricating a non-volatile memory cell constituting the non-volatile memory integrated circuit device according to another embodiment of the present invention.
Figure 10A:
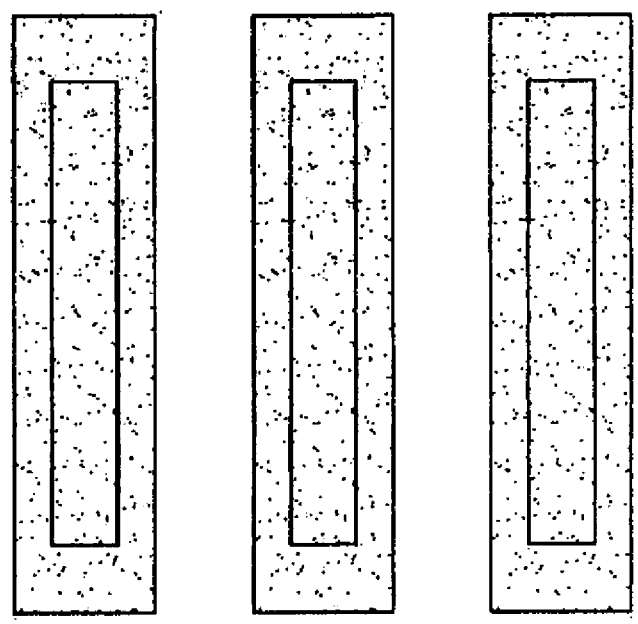
Figure 10B:
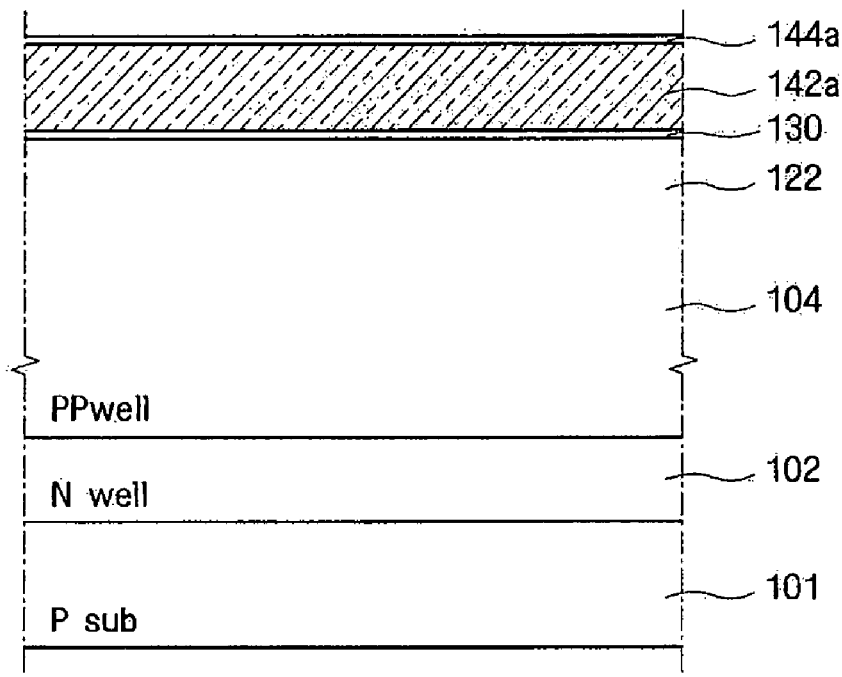
Figure 10C:
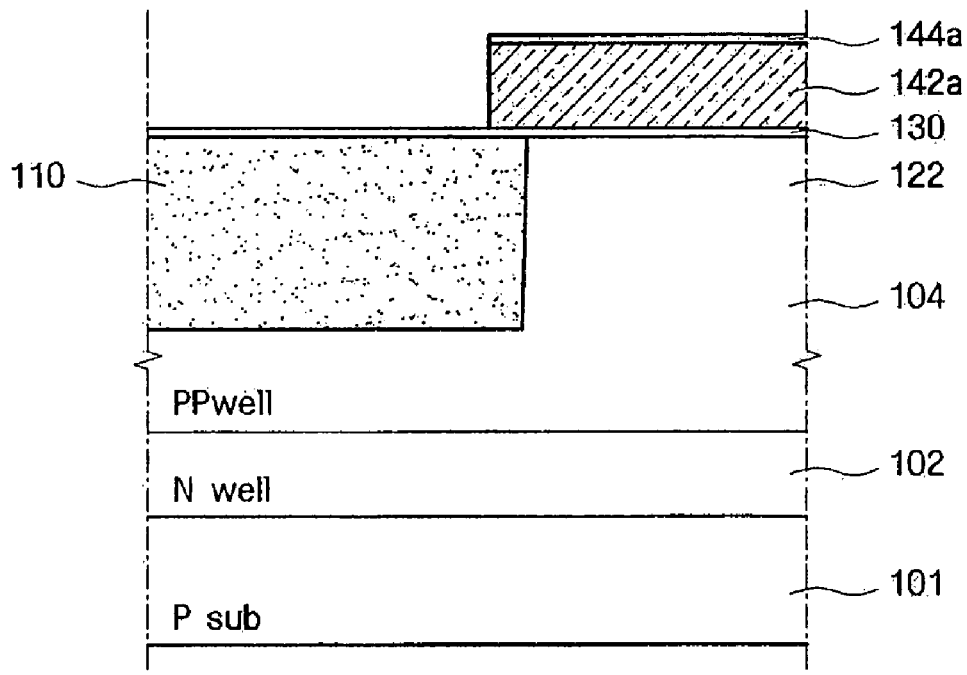

Referring to FIGS. 10A to 10C, a tunneling dielectric layer 130 is formed on a semiconductor substrate 101 in which a plurality of substantially rectangular field regions 110 is formed in a matrix form. The tunneling dielectric layer 130 may be formed to have a thickness of about 60 to 100 Å, and preferably about 70 to 80 Å, using a single film made of $SiO_2$, SiON, $La_2O_3$, $ZrO_2$ or $Al_2O_3$, or a stack or mixed film made of $SiO_2$, SiON, $La_2O_3$, $ZrO_2$ and/or $Al_2O$ through to CVD or ALD.

Thereafter, a first conductive film used to form a floating gate and a dielectric layer used to form an inter-gate dielectric layer are sequentially formed on the tunneling dielectric layer 130. In this case, the first conductive film may be formed to have a thickness of 1000 to 3000 Å using a polycrystalline silicon film doped with an impurity through CVD. The dielectric layer may be formed using a single film formed of an oxide film or a nitride film, or a stack or mixed film formed of an oxide film and a nitride film. For example, the dielectric layer may be formed using a stack film formed of an oxide film, a nitride film, and an oxide film (a so called "ONO film"). The stack film formed of an oxide film, nitride film and oxide film may be formed to have thicknesses of 100 Å, 100 Å, and 40 Å, respectively, through CVD or ALD.

Thereafter, a dielectric layer pattern 142a and a first conductive film pattern 144a are formed by sequentially performing primary patterning P1 on the dielectric layer and the first conductive film.

Figure 11A:
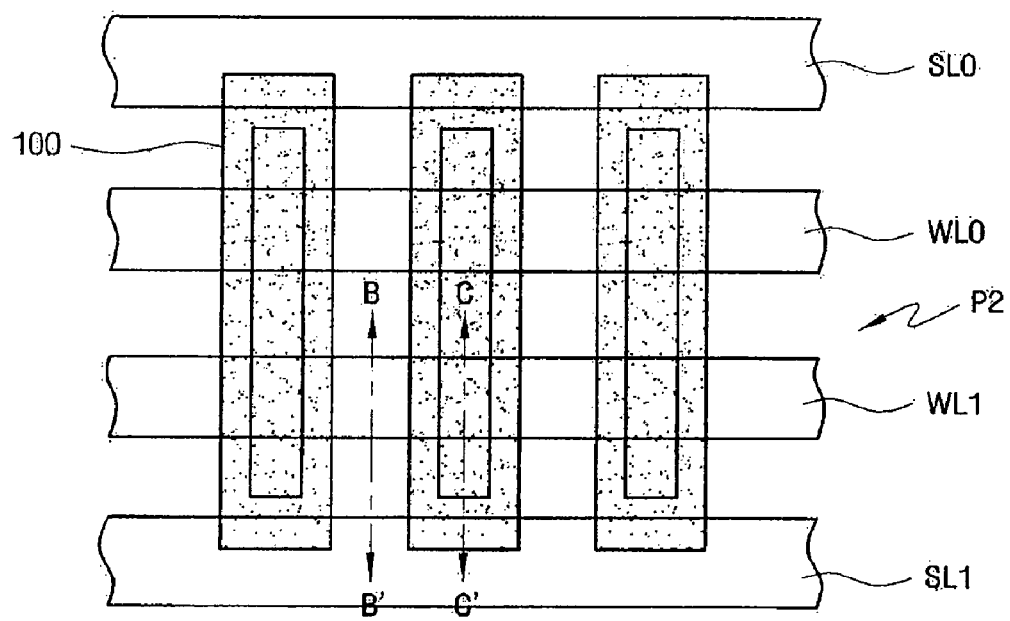
FIGS. 11A to 11C are views illustrating a method of fabricating a non-volatile memory cell constituting the non-volatile memory integrated circuit device according to still another embodiment of the present invention.
Figure 11B:
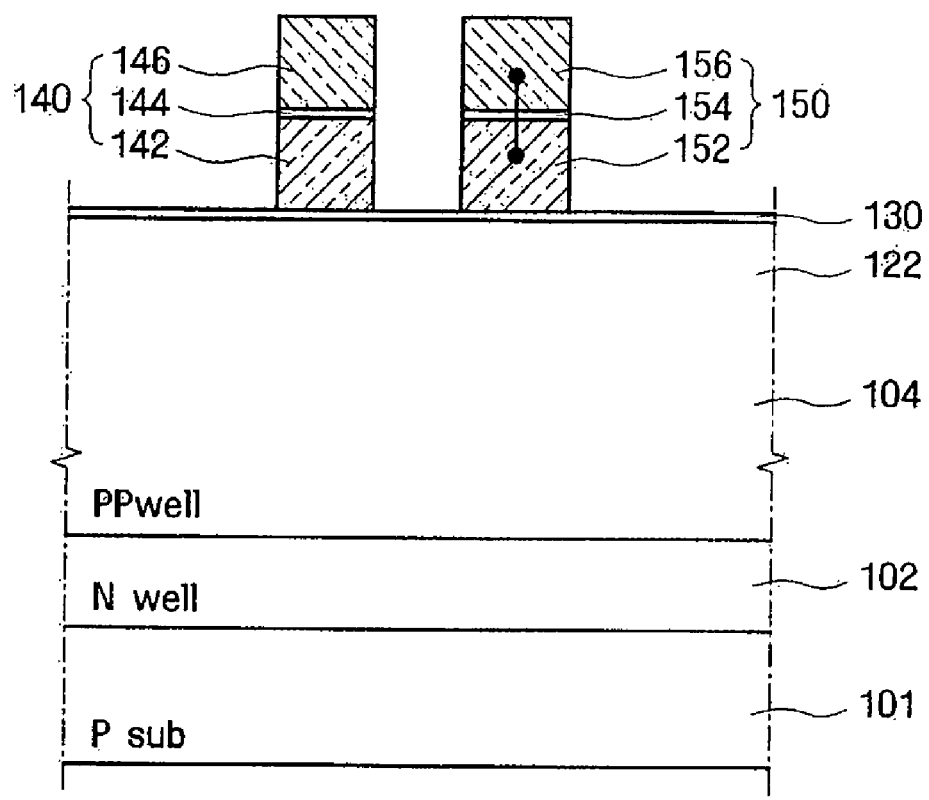
Figure 11C:
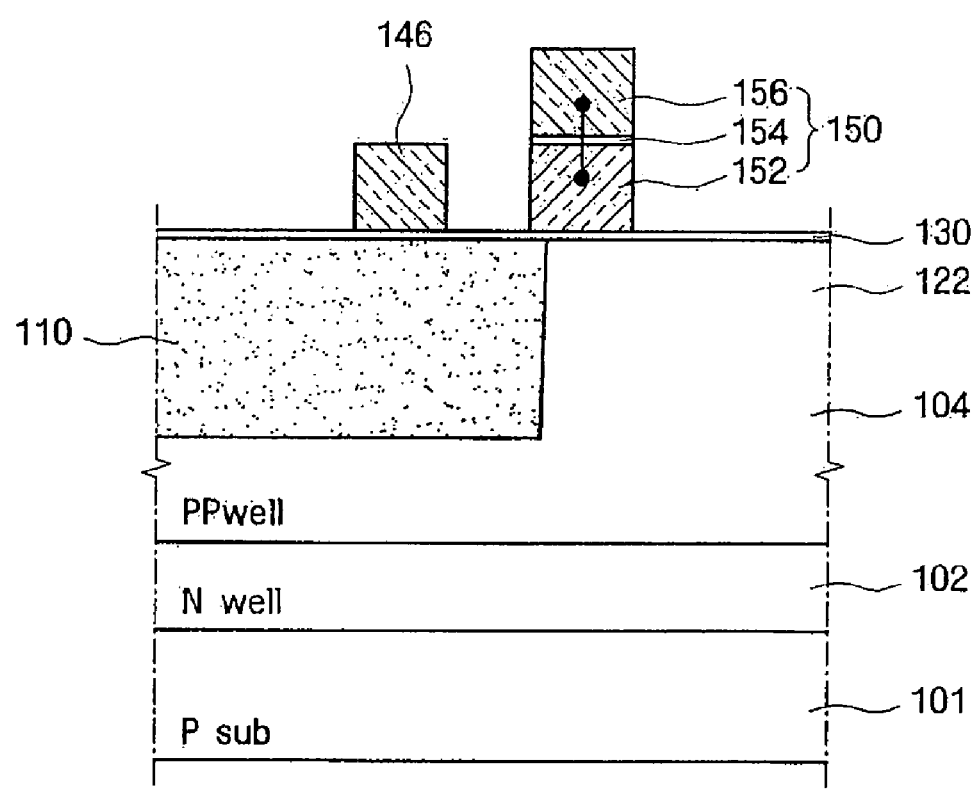

Referring to FIGS. 11A and 11C, a second conductive film used to form the control gate 146 is formed on the result of the first patterning P1. The second conductive film may be formed of a single film formed of a polycrystalline silicon film doped with an impurity, a metal silicide film or a metal film, or a multi-layer film formed of a metal film/a metal barrier film, a metal film/a polycrystalline silicon film doped with an impurity, a metal silicide film/a metal silicide film, and a metal silicide film/a polycrystalline silicon film doped with an impurity. The metal may be W, Ni, Co, Ru—Ta, Ni—Ti, Ti—Al—N, Zr, Hf, Ti, Ta, Mo, Ta—Pt, Ta—Ti or W—Ti, the metal barrier material may be WN, TiN, TaN, TaCN or MoN, and the metal silicide may be WSix, CoSix or NiSix. However, the present invention is not limited thereto.

Thereafter, a memory gate 140, which is composed of the control gate 146, the inter-gate dielectric layer 144 and the floating gate 142, and the select gate 150, which is spaced apart from the memory gate 140 by a predetermined distance, are formed by sequentially performing second patterning P2 on the second conductive film, the dielectric layer pattern 142a and the first conductive film pattern 144a.

Referring to FIGS. 2A to 2D again, an N-type low-concentration impurity is implanted with a low energy using the result of the second patterning P2 as a mask.

Thereafter, the spacers 160 are formed on both sidewalls of the memory gate 140 and the select gate 150. In an embodiment of the present invention, the gap between the memory gate 140 and the select gate 150 is not sufficiently wide, therefore the spacer 160 formed on one side of the memory gate 140 and the spacer 160 formed on one side of the select gate 150 opposite the memory gate 140 can be connected to each other without being completely separated from each other.

Thereafter, the bit line junction region 126, the floating junction region 124, and the common source region 122 are formed by implanting an N-type high-concentration impurity with a high energy using the memory gate 140 and the select gate 150 with the spacers 160 formed thereon as masks. If the spacer 160 formed on one sidewall of the memory gate 140 and the spacer 160 formed on one sidewall of the select gate 150 opposite the memory gate 140 are interconnected as described above, an N-type high-concentration impurity region may not be formed in the floating junction region 124. In contrast, the bit line junction region 126 and the common source region 122 may be of an LDD type, in which a low-concentration impurity is doped shallowly and a high-concentration impurity is doped deeply. Therefore, the floating junction region 124 may be formed to be thin compared with the bit line junction region 126 and the common source region 122.

Thereafter, by performing the step of forming wiring so that electrical signals can be input and output to and from the memory cell, the step of forming a passivation layer on the substrate, and the step of packaging the substrate according to processes that are well known to those skilled in the semiconductor field, the non-volatile memory integrated circuit device is completed.

The non-volatile memory integrated circuit device and method of fabricating the same as described above have one or more of the following advantages. Since the channel width of the select transistor is increased, on-cell current can be increased during the read operation of the select transistor. Furthermore, the channel width of the select transistor can be increased without additionally increasing the size of a layout.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory integrated circuit device comprising:
    a semiconductor substrate having a plurality of substantially rectangular field regions arranged in a matrix form, a short side and a long side of each of the substantially rectangular field regions being parallel to a row direction and a column direction of a matrix, respectively;
    word lines and select lines extending parallel to the row direction of the matrix on the semiconductor substrate, the word lines crossing the substantially rectangular field regions arranged in the row direction of the matrix, and the select lines partially overlapping the substantially rectangular field regions arranged in the row direction of the matrix, such that overlapping parts of long sides of the substantially rectangular field regions and overlapping short sides of the overlapping substantially rectangular field regions are located below the select lines without crossing the select lines such that end portions of the substantially rectangular field regions are located below the select lines; and
    a floating junction region formed within the semiconductor substrate between the word lines and the select lines, a bit line junction region formed opposite the floating junction region with respect to the word lines, and a common source region formed opposite the floating junction region with respect to the select lines.

2. The non-volatile memory integrated circuit device of claim 1, wherein, assuming that a length of an overlapping part of the long side of each of the overlapping substantially rectangular field regions is "a" and a depth of the substantially rectangular field region is "b", a≦b.

3. The non-volatile memory integrated circuit device of claim 1, wherein the semiconductor substrate is of a first conduction type, and includes a second conduction-type first well, which is formed within the semiconductor substrate, and a first conduction-type second well, which is formed within the first well.

4. The non-volatile memory integrated circuit device of claim 3, wherein the floating junction region, the bit line junction region, and the common source region are formed within the second well.

5. The non-volatile memory integrated circuit device of claim 1, wherein each of the select lines has a stack structure in which a plurality of conductive films, which are electrically interconnected to each other, is stacked.

6. The non-volatile memory integrated circuit device of claim 5, wherein the conductive films are electrically interconnected to each other through a butting contact.

7. The non-volatile memory integrated circuit device of claim 1, wherein the floating junction region is formed to be shallower than the bit line junction region and the common source region.

8. The non-volatile memory integrated circuit device of claim 7, wherein each of the bit line junction region and the common source region has a Light Doped Drain (LDD) structure, in which a low-concentration impurity is shallowly doped and a high-concentration impurity is deeply doped, and the floating junction region is shallowly doped with a low-concentration impurity.

9. A non-volatile memory integrated circuit device comprising:
a semiconductor substrate having a plurality of first active regions extending in a first direction, and a plurality of second active regions extending in a second direction to cross the plurality of first active regions; a plurality of field regions arranged on the semiconductor substrate, wherein the plurality of first active regions are defined by first sides of the plurality of field regions, and wherein the plurality of second active regions are defined by second sides of the plurality of field regions; a plurality of select lines and word lines extending in the first direction on the semiconductor substrate, wherein two select lines are arranged to cross the plurality of second active regions and partially overlap in each of the first active regions and two word lines are not arranged in each first active region but are arranged to cross the plurality of second active regions; and a common source region formed within a first active region between the two select lines, a bit line junction region formed within a second active region between the two word lines, and a floating junction region formed within a second active region between each of the select lines and each of the word lines.

10. The non-volatile memory integrated circuit device of claim 9, wherein the semiconductor substrate is of a first conduction type, and includes a second conduction-type first well, which is formed within the semiconductor substrate, and a first conduction-type second well, which is formed within the first well.

11. The non-volatile memory integrated circuit device of claim 10, wherein the floating junction region, the bit line junction region, and the common source region are formed within the second well.

12. The non-volatile memory integrated circuit device of claim 9, wherein each of the select lines has a stack structure in which a plurality of conductive films, which are electrically interconnected to each other, is stacked.

13. The non-volatile memory integrated circuit device of claim 12, wherein the conductive films are electrically interconnected to each other through a butting contact.

14. The non-volatile memory integrated circuit device of claim 9, wherein the floating junction region is formed to be shallower than the bit line junction region and the common source region.

15. The non-volatile memory integrated circuit device of claim 14, wherein each of the bit line junction region and the common source region has an LDD structure, in which a low-concentration impurity is shallowly doped and a high-concentration impurity is deeply doped, and the floating junction region is shallowly doped with a low-concentration impurity.

16. A method of fabricating a non-volatile memory integrated circuit device, the method comprising:
providing a semiconductor substrate in which a plurality of substantially rectangular field regions are arranged in a matrix form, a short side and a long side of each of the substantially rectangular field regions being parallel to a row direction and a column direction of a matrix, respectively;
forming word lines and select lines extending parallel to the row direction of the matrix on the semiconductor substrate, wherein the word lines cross a plurality of substantially rectangular field regions arranged in the row direction of the matrix, the select lines partially overlap the substantially rectangular field regions arranged in the row direction of the matrix, such that overlapping parts of long sides of the substantially rectangular field regions and overlapping short sides of the substantially rectangular field regions are located below the select lines without crossing the select lines such that end portions of the substantially rectangular field regions are located below the select lines; and
forming a floating junction region formed within the semiconductor substrate between the word lines and the select lines, a bit line junction region formed opposite the floating junction region with respect to the word lines, and a common source region formed opposite the floating junction region with respect to the select lines.

17. The method of claim 16, wherein, assuming that a length of an overlapping part of the long side of each of the overlapping substantially rectangular field regions is "a" and a depth of the substantially rectangular field region is "b", $a \leq b$.

18. The method of claim 16, further comprising forming a first well having a conductive type different from that of the semiconductor substrate within the semiconductor substrate, and a second well having a conductive type different from that of the first well within the first well.

19. The method of claim 18, wherein the floating junction region, the bit line junction region, and the common source region are formed within the second well.

20. The method of claim 16, wherein the forming the word lines and the select lines comprises:
sequentially forming a first conductive film and a dielectric layer on the semiconductor substrate;
primarily patterning the dielectric layer and the first conductive film to form a dielectric layer pattern and a first conductive film pattern;
forming a second conductive film on a product of the first patterning; and
secondarily patterning the second conductive film, the dielectric layer pattern, and the first conductive film pattern.

21. The method of claim 16, wherein the forming the floating junction region, the bit line junction region, and the common source region comprises:
implanting a low-concentration impurity with a low energy using the word lines and the select lines as masks;
forming spacers on sidewalls of the word lines and the select lines; and
implanting a high-concentration impurity with a high energy using the word lines and the select lines, in which the spacers are formed, as masks.

* * * * *